United States Patent [19]

Johnson, Jr. et al.

[11] 3,920,483

[45] Nov. 18, 1975

[54] METHOD OF ION IMPLANTATION THROUGH A PHOTORESIST MASK

[75] Inventors: Claude Johnson, Jr., Yorktown Heights; Ku San-Mei, Poughkeepsie; Harold Vinell Lillja, Peekskill; Edward Shih-To Pan, Poughkeepsie, all of N.Y.

[73] Assignee: IBM Corporation, Armonk, N.Y.

[22] Filed: Nov. 25, 1974

[21] Appl. No.: 527,115

[52] U.S. Cl. ........................ 148/1.5; 117/93; 156/3; 204/164; 204/193; 357/91

[51] Int. Cl.[2] ........................................ H01L 21/26

[58] Field of Search ............ 148/1.5; 117/93; 156/3; 204/193, 164; 357/91

[56] References Cited

UNITED STATES PATENTS

| | | | |
|---|---|---|---|
| 3,113,896 | 12/1963 | Mann | 156/3 |
| 3,410,776 | 11/1968 | Bersin | 204/193 |
| 3,570,112 | 3/1971 | Barry et al. | 148/1.5 X |
| 3,575,745 | 4/1971 | Hill | 156/3 |
| 3,615,956 | 10/1971 | Irving et al. | 148/1.5 X |
| 3,653,977 | 4/1972 | Gale | 148/1.5 |
| 3,663,265 | 5/1972 | Lee et al. | 117/93 |
| 3,771,948 | 11/1973 | Matsumiya | 148/1.5 X |
| 3,793,088 | 2/1974 | Eckton, Jr. | 148/1.5 |

OTHER PUBLICATIONS

Irving, "A Dry Photoresist Removal Method," Kodak Photoresist Seminar Proceedings, 1968 Edition, Vol. II, pp. 26–29.

Irving, "A Plasma Oxidation Process For Removing Photoresist Films," Solid State Technology, June 1971, pp. 47–51.

Bersin, "Automatic Plasma Machines For Stripping Photoresist," Solid State Technology, June 1970, pp. 39–45.

*Primary Examiner*—L. Dewayne Rutledge
*Assistant Examiner*—J. M. Davis

[57] ABSTRACT

An improvement in the method of ion implantation into a semiconductor substrate through a photoresist mask wherein the photoresist mask is subjected to an RF gas plasma oxidation prior to the ion implantation step for a period sufficient to reduce the thickness of the photoresist layer. The ion implantation is then carried out through the treated photoresist mask.

7 Claims, 6 Drawing Figures

METHOD OF ION IMPLANTATION THROUGH A PHOTORESIST MASK

BACKGROUND OF THE INVENTION

The present invention relates to an improved method of ion implantation through photoresist masks. Photoresist masks for ion implantation have been used in the semiconductor art to define regions in a semiconductor substrate into which ions are introduced by ion implantation. A typical technique for ion implantation through photoresist masks is set forth, for example, in U.S. Pat. No. 3,793,088.

In using photoresist masks as ion barriers in ion implantation processes, we have found that photoresists in general tend to flow during the ion bombardment involved in an ion implantation step, particularly in high dosage ion implantation methods in the order of $1 \times 10^{16}$ ions per $cm^2$ or greater and high energy ion implantation methods in the order of 150KeV or greater. Of course, such flowing of the photoresist tends to limit possible lateral dimensional tolerances in the horizontal geometry of the regions being implanted. In semiconductor devices in integrated circuits which are less dense and, thus, have greater horizontal geometry tolerances, the flowing of the photoresist may not be sufficient to render the use of photoresist masking ineffectual. However, with the ever-increasing high density of integrated circuits in large scale integration, even minimal flowing of photoresist becomes a very undesirable and potentially damaging factor.

Attempts have been made to limit photoresist flowing during ion implantation steps by subjecting the photoresist to severe pre-baking steps in the order of 200°–210° C for 30 to 60 minutes prior to the ion implantation step. However, such severe pre-baking steps make the photoresist virtually impossible to remove by conventional photoresist stripping techniques.

In addition, it has been noted that the ion implantation step itself, particularly high dosage and high energy implantation steps, also tend to harden the photoresist, increasing its difficulty of removal by conventional photoresist stripping techniques.

SUMMARY OF THE PRESENT INVENTION

Accordingly, it is an object of the present invention to provide a method of ion implantation through a photoresist mask wherein the photoresist mask substantially does not flow.

It is a further object of the present invention to provide a method of ion implantation through a photoresist mask wherein the photoresist mask is readily removable by conventional stripping techniques subsequent to the ion implantation step.

It is yet a further object of the present invention to provide a method of ion implantation through a photoresist mask wherein the photoresist mask does not flow during ion implanation and, further, is readily removable by conventional stripping techniques upon the completion of the ion implantation step or steps.

It is still a further object of the present invention to provide a method of ion implantation through a photoresist mask wherein the photoresist mask may be applied directly to the semiconductor surface to function as the sole barrier mask to the ions being implanted.

In accordance with the present invention, a method of ion implantation through a photoresist mask is provided wherein a photoresist mask is first formed on the integrated circuit substrate to be implanted by conventional techniques and has a thickness in excess of its selected thickness which is sufficient to prevent ion penetration into the substrate during the subsequently performed ion implantation step, as well as openings corresponding to the regions to be formed by implantation.

Then, before the ion implantation step, the photoresist mask is subjected to a standard RF plasma oxidation for a period sufficient to reduce said excess in thickness from the surface of the photoresist mask. This reduction or removal step is, in effect, a partial RF plasma oxidation.

The standard RF plasma oxidations have been known and used in the art usually for complete photoresist removal after the photoresist has been utilized as a barrier mask for conventional photolithographic etching in the fabrication of integrated circuits.

However, we have surprisingly found that when only a portion of the photoresist mask is treated by RF plasma oxidation so as to only reduce the photoresist in thickness, the remaining mask displays substantially no flowing during ion implantation steps. In addition, it remains readily strippable after usage and is apparently thus unaffected by the ion bombardment during the ion implantation step.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1:
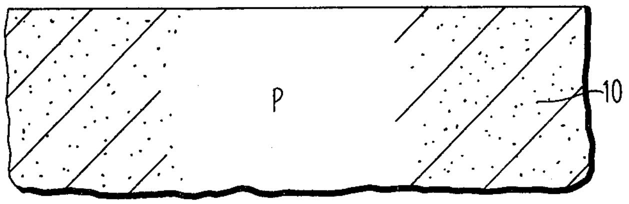
FIGS. 1–6 are diagrammatic cross-sectional views of a portion of an integrated circuit substrate during the ion implantation steps in accordance with the present invention.
Figure 2:
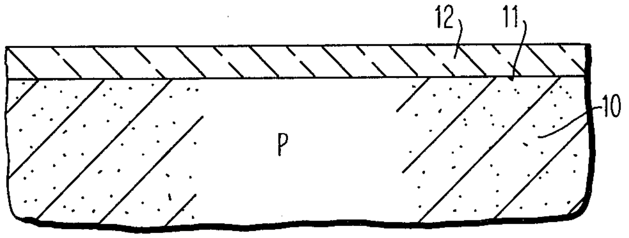

With reference to FIGS. 1–6, there will now be described an embodiment of the present invention. Commencing with a P type semiconductor substrate region 10, as shown in FIG. 1, having a P type impurity concentration of $1 \times 10^{15}$ ions per $cm^3$, a thermal oxidation technique is carried out in the conventional manner to form on the surface 11 of substrate 10 a layer of silicon dioxide 12, a few microns in thickness, as shown in FIG. 2.

Figure 3:
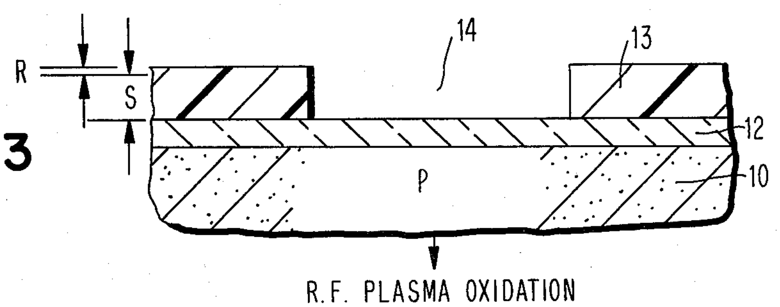

Next, FIG. 3, a layer of photoresist 13 is applied to silicon dioxide layer 12 in the conventional manner, e.g., by spinning, after which it is baked at a temperature in the order of 140° C for a period of 20 to 30 minutes. Photoresist layer 13, for the purposes of the present example, is a positive photoresist composition which is a photosensitive composition including a diazoketone sensitizer, the 4′-2′-3′ dihydroxybenzophenone ester of 1-oxo-2-diazonaphthalene-5-sulfonic acid, and an m-cresol formaldehyde novolak resin of approximately 1,000 average molecular weight having the structure

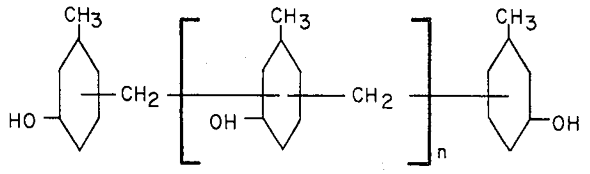

dissolved in a standard solvent such as ethyl cellosolve acetate. Instead of this particular photoresist, any conventional positive photoresist may be utilized. A positive photoresist is a coating normally insoluble in developer which is rendered soluble in the areas exposed to light. Such photoresists, such as those described in U.S. Pat. Nos. 3,046,120 and 3,201,239, include diazo type photoresists which change to azo compounds in the areas exposed to light, and are thereby rendered soluble in the developer solution.

When utilizing such a positive photoresist for the ion implantation masking material in accordance with the high energy, high dosage ion implantation which is to be subsequently described, the art normally recognizes that a selected thickness of photoresist mask is necessary. The thickness which the art deems necessary is, of course, determined by primarily the ion implantation energy and species of the projetile ions to which the mask is to be subjected. In FIG. 3, this selected thickness, which has been designated by the letter S, is about 15,000A. For most ion implantation masking, the art has recognized that the photoresist mask should be in excess of 10,000A in thickness, and preferably have a thickness from 15,000A to 25,000. In the embodiment of the present invention, photoresist layer 13 has a thickness designated by the letter R in addition to the selected thickness necessary to withstand the ion implantation bombardment. Photoresist masking layer 13, of course, has suitable apertures 14 which permit the passage of ions.

The portion R of the photoresist layer 13 which is to be removed in the subsequent RF plasma oxidation step is at least 1,000A in thickness.

Figure 4:
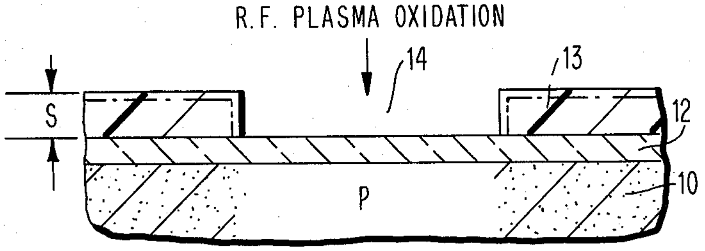

Next, FIG. 4, the masked substrate is subjected to an RF gas plasma oxidation for a period sufficient to remove portion R from the top surface of layer 13. This RF gas plasma oxidation process is carried out in the conventional manner described in the articles "A Dry Photoresist Removal Method" by S. M. Irving, *Kodak Photoresist Seminar Proceedings*, 1968 edition, Volume 2, at pp. 26–29; "A Plasma Oxidation Process for Removing Photoresist Films", also by S. M. Irving, published in *Solid State Technology*, June 1971, pp. 47–51, and "Automatic Plasma Machines for Stripping Photoresist", R. L. Berson, *Solid State Technology*, June 1970, pp. 39–45, using conventional RF gas plasma oxidation equipment such as that described in U.S. Pat. No. 3,615,956. In the particular example shown, an exposure of the substrate for 45 seconds in such an RF gas plasma oxidation apparatus operating under an RF power of 100 watts with an oxygen flow rate of 150 cc's per minute reduces the thickness of layer 13 by a thickness of R. It will, of course, be understood by one skilled in the art, in view of the teachings in said patent and said articles, that the RF gas plasma oxidation equipment will be operable under other conditions to reduce varying thicknesses of photoresist material from the upper surface of the material.

We have surprisingly found that when a portion of the photoresist layer in excess of 1,000A is removed, the remaining layer S substantially does not flow when subjected to ion implantation as will be subsequently described. Also, the remaining photoresist is very readily removable by conventional stripping techniques upon the completion of the ion implantation.

While we have not established the nature of the structural changes that take place in the photoresist as the partial plasma oxidation, the results appear to indicate that some structural change does take place in the layer of the photoresist close to the surface of the remaining portion R. The structural change appears to be similar to a "case-hardening" effect in the surface region of portion R indicated by the phantom lines in FIG. 4.

Figure 5:
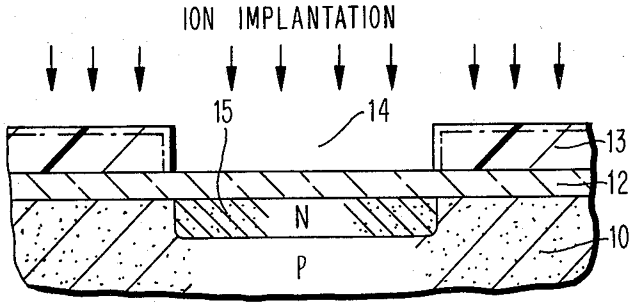
Figure 6:
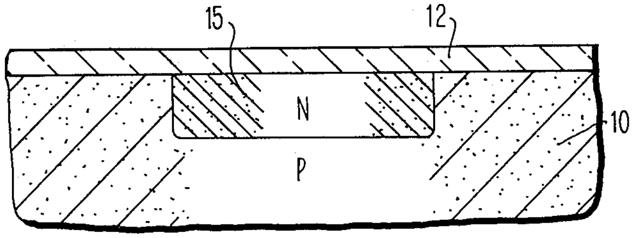

Next, FIG. 5., the ion implantation step is carried out to introduce an N type impurity, such as arsenic, through photoresist mask openings 14, then penetrating silicon dioxide layer 12 to form N type ion implanted region 15 in the substrate. The ion implantation is carried out in conventional high energy ion implantation equipment operating in the order of 500KeV for a cycle necessary to introduce a dosage of $2.5 \times 10^{16}$ ions/cm$^2$ of arsenic impurity in region 15.

Upon the completion of the ion implantation, layer 13 is removed by conventional photoresist stripping techniques, utilizing a stripper such as N-methyl pyrollidone or acetone for the positive diazo type photoresist used in the present example. When subjected to such a conventional stripper, layer 13 is removed completely and cleanly leaving the ion implanted structure shown in FIG. 6.

While the above example has been described with respect to a positive diazo type photoresist, the same results occur when utilizing the method of the present invention with negative type photoresist such as KTFR, distributed by the Kodak Corporation, a cyclized rubber composition containing a photosensitive cross-linking agent. Other photoresist materials which may be used are the negative photoresist materials including synthetic resins such as polyvinyl cinnamate or polymethyl methacrylate. A description of such photoresist compositions and the light sensitizers conventionally used in combination with them may be found in the text "Light Sensitive Systems", by Jaromir Kosar, particularly at chapter 4. Some photoresist compositions of this type are described in U.S. Pat. Nos. 2,610,120; 3,143,423; and 3,169,868.

Of course, it will be understood that the method of the present invention is also applicable when introducing a positive ion such as boron by ion implantation into a negative substrate. For example, boron at a dosage of $1.5 \times 10^{16}$ ions/cm$^2$ may be implanted with high energy equipment in the order of 150KeV using a photoresist having an initial thickness comprising a selected thickness S of 2.5 microns and an additional thickness R of 0.2 microns, the R being removed during the RF plasma oxidation step.

Finally, it should be pointed out that by substantially eliminating photoresist flow, the present invention makes it possible to utilize relatively thick photoresist masks in the order of 15,000A to 25,000A or even greater in thickness. As has been recognized, the extent of lateral flow under ion implantation condictions in conventional photoresist masks is related to the thickness, i.e., thicker layers have a greater lateral flow. Thus, by substantially solving the lateral flow problem, the present invention makes it possible to use thick photoresist masks which by themselves can serve as barriers to even high dosage, high energy implantation steps, thereby eliminating the need for additional auxiliary masks in insulative materials in combination with the photoresist masks. When used alone as a barrier mask, the photoresist mask may be applied directly to the semiconductor substrate when the need arises instead of on the silicon dioxide layer as shown in the example.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In the method of forming regions of a selected conductivity characteristic in a semiconductor substrate by ion implantation through a photoresist mask having a selected thickness sufficient to prevent ion penetration into said substrate and openings corresponding to said regions, the improvement comprising first forming a photoresist mask having a thickness of (S+R), where S is said selected thickness and R is at least 1,000A, and then, prior to said ion implantation step, subjecting said mask to a gas plasma oxidation for a period sufficient to reduce the photoresist thickness by R.

2. The method of claim 1 wherein said gas plasma oxidation is an RF gas plasma oxidation.

3. The method of claim 2 wherein S is at least 10,000A in thickness.

4. The method of claim 3 wherein S is from 15,000A to 25,000A in thickness.

5. The method of claim 3 wherein said photoresist is a positive photoresist.

6. The method of claim 3 wherein said photoresist is a negative photoresist.

7. The method of claim 3 wherein the photoresist mask is applied directly to a semiconductor material substrate.

* * * * *